July 26, 1966 T. P. NOWALK 3,263,178
UNITARY SEMICONDUCTOR DEVICE PROVIDING FUNCTIONS OF
A PLURALITY OF TRANSISTORS
Filed Aug. 31, 1962

United States Patent Office 3,263,178

Patented July 26, 1966

3,263,178

UNITARY SEMICONDUCTOR DEVICE PROVIDING FUNCTIONS OF A PLURALITY OF TRANSISTORS

Thomas P. Nowalk, Irwin, Pa., assignor to Westinghouse Electric Corporation, East Pittsburgh, Pa., a corporation of Pennsylvania

Filed Aug. 31, 1962, Ser. No. 220,674
5 Claims. (Cl. 330—30)

This invention relates generally to semiconductor amplifiers capable of handling relatively large amounts of power and, more particularly, to semiconductor devices which provide the functions of at least two mtached transistor amplifiers within a unitary body of semiconductive material.

A form of semiconductor power amplifier which has had considerable use is that comprising a substrate with a fused rectifying contact for the collector on one surface and a dot and concentric ring structure on the other surface including, in sequence from the center, a circular ohmic contact, a first emitter, a second ohmic contact, a second emitter and a third ohmic contact. Such a structure permits high power amplification and is also capable of achieving relatively high gain by reason of cascading portions of the device in a manner as taught by Henkels and Nowalk in copending application Ser. No. 11,686, filed February 29, 1960, and assigned to the same assignee as the present invention. However, when it is desired to provide the function of two transistors having carefully matched characteristics with a common region, previously known modifications of the aforementioned power amplifier structure have been found not to be entirely satisfactory.

It is therefore an object of the present invention to provide an improved semiconductor power amplifier.

Another object is to provide within a unitary body of semiconductive material the functional equivalent of two transistor amplifiers with a common region and having matched characteristics with effective electrical isolation between the portions providing transistor functions.

Another object is to provide improved methods for fabricating multitransistor devices.

In accordance with the present invention a semiconductor amplifier device is provided comprising a substrate of semiconductive material of a first type of semiconductivity having opposed major surfaces with electrode members on each of the major surfaces including at least two electrodes in rectifying contact and at least two electrodes in ohmic contact with a first major surface. On the other major surface there is at least one electrode in rectifying contact therewith disposed opposite the electrodes in rectifying contact with the first major surface. A principal improvement in accordance with this invention which permits improved performance and new device applications is that the electrodes on the first major surface are disposed in two groups of rectifying and non-rectifying contacts symmetrically about an isolating barrier which is to provide electrical isolation between the two groups of contacts.

In a preferred form of the invention, the lower contact extends continuously over the second major suface and serves as the collector of the device while the contacts on the first major surface are disposed in a dot and annular ring pattern of which alternate ones are ohmic and the remaining alternate ones are rectifying. Each of the rings and dots are divided either prior to or after fusion to the substrate, along the line defined by a groove extending into the substrate, to provide geometrical symmetry about the groove and, hence, like characteristics for the symmetrical portions of the structure.

The present invention, both as to its organization and manner of operation, together with the above mentioned and further objects and advantages thereof, may best be understood by reference to the following description, taken in connection with the accompanying drawings, in which.

Figure 1:
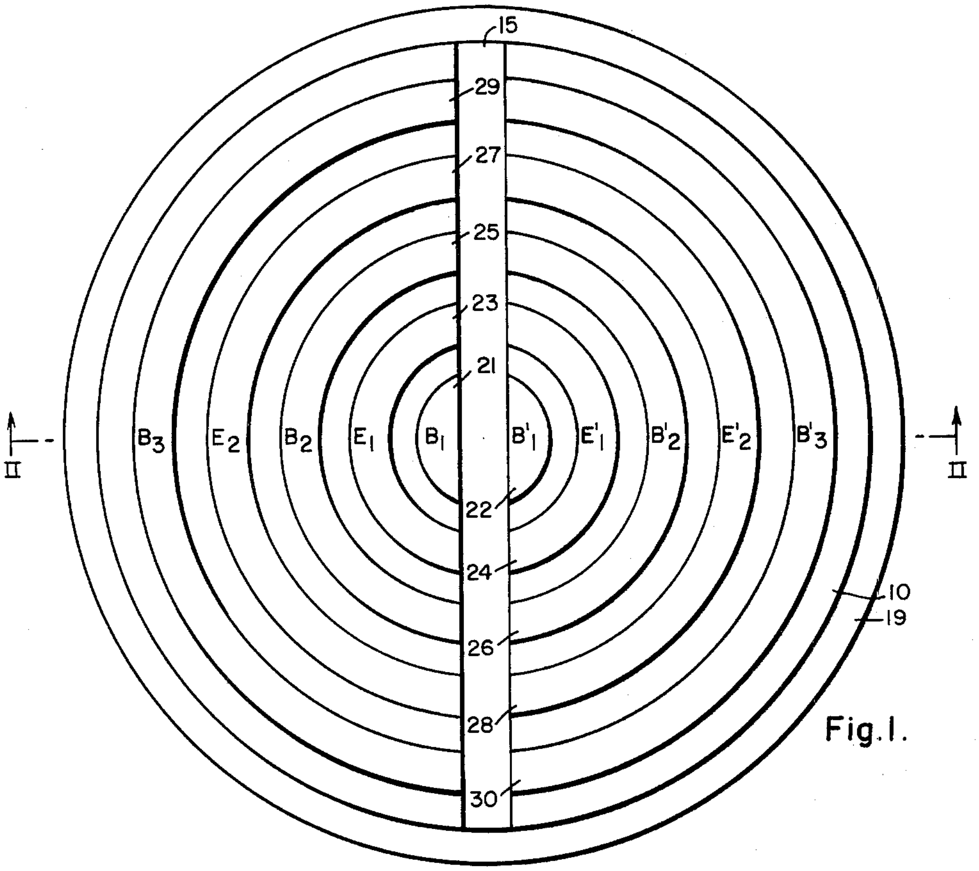
FIGURE 1 is an enlarged plan view of one device in accordance with the present invention.
Figure 2:
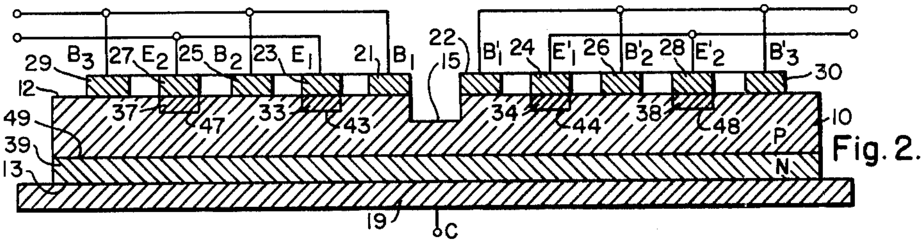
FIG. 2 is an enlarged, cross-sectional view of the device of FIG. 1 taken along the line II—II with an illustration of one manner of interconnecting the electrodes.

Referring to FIGS. 1 and 2, a device in accordance with this invention will be described by way of example. The device comprises a substrate 10 of a first type of semiconductivity, here shown as p-type, having opposing major surfaces 12 and 13 which are the upper and lower surfaces, respectively, as shown in FIG. 2. On a first major surface 12 there are disposed a plurality of electrodes in two groups symmetrically arranged about a groove 15 which extends diametrically across the first major surface 12. Each of the two groups of contacts or electrodes in this exemplary device includes, in sequence from the center of the device, a first base contact 21 and 22, a first emitter contact 23 and 24, a second base contact 25 and 26, a second emitter contact 27 and 28 and a third base contact 29 and 30.

Each of the base contacts 21, 22, 25, 26, 29 and 30 is in ohmic contact with the substrate and may conveniently be formed by the fusion of alloy foil members containing an impurity of the same type as predominates in the substrate 10. Each of the emitter contacts 23, 24, 27 and 28 is in rectifying contact with the substrate 10 and may conveniently be formed by the fusion of alloy foil members containing an impurity opposite to that which predominates in the substrate 10. Here the emitters include a donor type impurity so that n-type recrystallized regions 33, 34, 37 and 38 are formed on the substrate.

The n-type regions 33, 34, 37 and 38 form p-n junctions 43, 44, 47 and 48, respectively, with the substrate 10.

The contacts 21 through 30 are elongated or strip-like so that full utilization of the semiconductive surface is possible for highest gain and power handling capacity. That is, every point of each of the rectifying contacts is relatively close to one of the ohmic contacts.

For convenience in the following discussion the contacts 21 through 30 will be sometimes referred to as $B_1$, $B_1'$, $E_1$, $E_1'$, $B_2$, $B_2'$, $E_2$, $E_2'$, $B_3$ and $B_3'$, respectively, as indicated in the drawing. E refers to contacts forming p-n junctions and thus suitable for operation as emitters. B refers to ohmic contacts which are suitable for use as base contacts.

The configuration shown is one in which the substrate 10 is generally circular, the first base contacts $B_1$ and $B_1'$ are substantially semicircular in configuration and located at the center of the first major surface 12 of the substrate 10 and the remaining contacts are concentric, arcuate members. The first base contacts $B_1$ and $B_1'$ would form a complete circle if not separated by the groove 15 and the remaining pairs of contacts on opposite sides of the groove would form annular rings. The spacing of the electrodes on each side of the groove is relatively close so as to permit electrical interaction therebetween. For example, $B_1$, $E_1$, $B_2$, $E_2$ and $B_3$ are arranged so as to permit electrical interaction between adjacent ones when potentials are applied to the device. The required spacing depends in part upon the carrier diffusion length in the substrate material 10 since it is desired that a potential applied to the base contacts control the current from the emitters to the collector contact 19 disposed on the opposite surface. The groove 15 extending into the substrate 10 serves as an isolating barrier to electrically isolate the two groups of electrodes by being wide enough and deep enough to impose a large resistance into the path between adjacent electrodes of the two groups. The groove 15 also serves as a line of symmetry about which the contacts on the upper surface 12 are arranged. The symmetry of the structure results in the same characteristics on both sides.

On the second major surface 13 there is disposed a continuous electrode 19 in rectifying contact with the substrate to serve as the collector contact. The contact 19 will sometimes be referred to in the following discussion as C. The collector contact may conveniently be formed by the fusion of an alloy foil member containing a donor type impurity, of the same nature as the foil members for formation of the emitter contacts, to the lower surface of the substrate 10 so that upon recrystallization an n-type region 39 is formed producing a p-n junction 49 with the substrate 10.

It is to be understood that the drawing is not to scale but has been greatly exaggerated, particularly in the dimension perpendicular to the major surfaces, for clarity in illustration.

The device shown is capable of performing multi-transistor functions in various manners as will be subsequently discussed. Certain modifications of the device may be made of which a few will be mentioned. , The device of FIGS. 1 and 2 is what may be called a five ring structure since each device portion has five electrodes on the upper surface. The multielectrode structure is desirable in order to achieve a device capable of handling relatively high power and also, in some applications, a device capable of achieving relatively high gain. Furthermore, depending upon the availability of larger starting wafers for use as the substrate 10, additional electrodes may be provided in the pattern so as to be able to achieve even higher power handling levels and gain levels. Therefore, the number of electrodes which may be employed on the upper surface is not fixed but it has been found that the five ring structure shown is a good compromise to fully utilize wafers having a diameter of about ½ to 1 inch which are readily produced.

It will be readily seen that if desired the lower contact 19, serving as the collector in the exemplary device, need not be continuous but may be of one or more annular electrodes disposed opposite the emitter contacts on the other surface.

It is further evident that, if desired, the structure may be utilized such that the lower contact serves as a common emitter and the rectifying contacts on the upper surface serve as collectors. Furthermore, the contact to the lower surface of the substrate could be a non-rectifying contact to serve as a common base contact to the device with the electrodes on the upper surface being alternately emitter and collector contacts.

Figures 3, 4, 5:
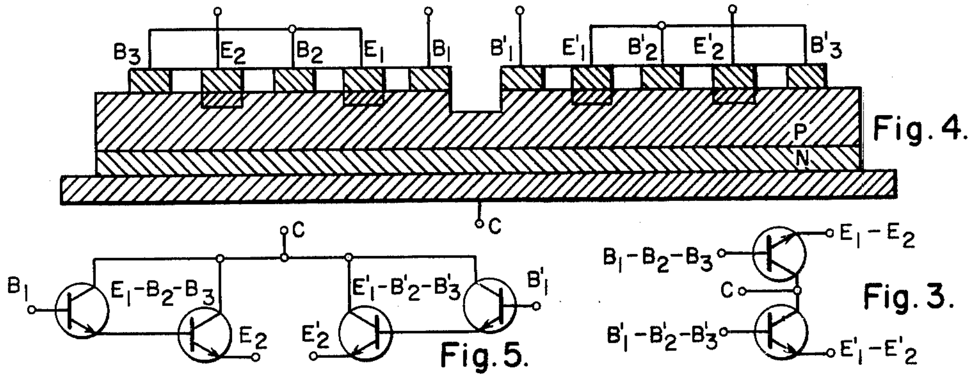
FIG. 3 is a schematic showing of the approximate equivalent circuit of the device as interconnected in FIG. 2.
FIG. 4 is another enlarged cross-sectional view of the device of FIG. 1 taken along the line II—II with an illustration of another manner of interconnecting the electrodes.
FIG. 5 is a schematic showing of the approximate equivalent circuit of the device as interconnected in FIG. 4.

In FIGS. 2 and 4, as will be subsequently discussed, interconnections are made between electrodes on the upper surface by external wiring or bridging. However, if desired, the interconnections may be made directly on the substrate by, for example, providing a gap in electrodes through which it is desired to pass to the electrode to which contact is to be made and employing foil members disposed on the substrate surface to provide the interconnection passing through the gap.

Devices in accordance with this invention need not necessarily employ an annular contact arrangement as shown but may use other geometrical configurations of elongated electrodes.

In the device shown a single groove 15 extends across the substrate to isolate two matched transistor portions having a common region. It will be apparent that if desired, an additional groove or grooves could be provided extending in other directions so as to divide the contacts on the upper surface into three or more electrically isolated groups symmetrically disposed about the center of the device so as to achieve the functions of three or more matched transistors.

Rectifying contacts are shown on the device of FIGS. 1 and 2 which may be formed by alloy fusion resulting in a recrystallized semiconductive region of opposite impurity type to that of the substrate and, in the same operation, a conductive connection thereon. It is to be understood that a like structure may result from providing the impurity introducing material in one operation and the conductive contact in a second such as by vapor diffusion of impurities with subsequent ohmic contact made thereto.

The isolating barrier, which is the groove 15 in the exemplary device, may vary in form depending on the techniques employed to form the semiconductive structure and contacts. For example, in a structure wherein the emitter regions 33, 34, 37 and 38 are formed by diffusion into a common p-type substrate, the isolating barrier could be an n-type region diffused along the line of symmetry between the two portions of the device to provide a floating p-n isolating junction. If the device is formed by diffusing impurities, say p-type; into a common substrate to form two separate transistor base regions with subsequent diffusion of n-type impurities for the emitters (often called a planar-double diffused structure), the isolating barrier is provided by the spacing between the base regions and the separate p-n junctions formed with the substrate.

In describing the invention, devices are shown in which a particular type of semiconductivity is ascribed to each semiconductive region. However, the semiconductivity type of the various regions may be reversed from that shown.

As an example, one form of the invention will be described hereinafter in a semiconductive silicon body. In addition to silicon, however, other semiconductive materials such as germanium or a semiconductive compound are suitable. Suitable semiconductive compounds include those of two elements of Group IV of the Periodic Table such as silicon carbide, a compound of an element of Group III of the Periodic Table and Group V of the Periodic Table such as gallium arsenide and a compound of an element of Group II of the Periodic Table and an element of Group VI of the Periodic Table such as cadmium sulfide.

A specific device in accordance with the description of FIGS. 1 and 2 was made in the following manner. A p-type silicon wafer 10, cut from a grown crystal, was obtained having boron doping to achieve a resistivity of from about 50 to about 150 ohm centimeters and a 200 microsecond lifetime. The silicon wafer was 0.0043 inch thick and had a diameter of 0.5 inch. The wafer as placed on a gold alloy foil for the contact C containing antimony as an n-type dopant in a composition of about 0.6% by weight antimony and the remainder gold. The collector foil had a diameter of 0.551 inch. On the upper surface there were disposed alloy foil members for the contacts B and E including a first base foil of a gold alloy containing 0.3 weight percent of boron and the remainder gold, having a diameter of 0.110 inch. The first base foil member, after subsequent processing, provides the contacts $B_1$ and $B_1'$. A first emitter foil member of the same composition as the collector contact and having an inner diameter of 0.119 inch and an outer diameter of 0.188 inch was disposed concentric with the first base foil to provide the contacts $E_1$ and $E_1'$ and in like manner base and emitter foil members of the same composition as the previously described base and emitter foils were disposed concentric therewith and having the following dimensions: the second base foil (for contacts $B_2$ and $B_2'$) had an inside diameter of 0.197 inch and an outside diameter of 0.276 inch; the second emitter foil (for contacts $E_2$ and $E_2'$) had an inside diameter of 0.285 inch and an outside diameter of 0.363 inch; the third base foil (for contacts $B_3$ and $B_3'$) had an inside diameter of 0.372 inch and an outside diameter of 0.449 inch. All of the foil members had a thickness of about 0.0015 inch.

The wafer with foil members in place was then inserted in a furnace and the temperature raised to about 700° C. to fuse the electrode foils to the silicon wafer. As a result ohmic contacts are formed by the base foil members and p-n junctions are formed by the emitter and collector foils. Thereafter, either before or after interconnections are made between selected electrodes on the upper surface, there is disposed thereon a layer of masking material such as Apiezon wax and a line is scribed through the wax to expose the foil members and the silicon surface between adjacent foil members. Then the structure is subjected to aqua regia which is capable of etching through the gold alloy down to the silicon surface. Then a silicon etchant, such as one of equal parts nitric, hydrofluoric and acetic acids, is used to etch into the substrate a suitable distance which may be about 1.5 mil, to provide isolation. It is sometimes preferable to separate the fused foil members between the affixing of the bridges or interconnections and the final clean-up etch of the silicon. In this way problems of junctions being shorted during the brazing of the interconnections is minimized.

It will be appreciated that other techniques may be employed in order to sever the fused alloys and to provide a groove into the substrate surface. These include machining, sandblasting, or subjecting to charged particle or electromagnetic radiation such as an electron beam or a laser.

It is also suitable to form the device structure by starting with individual alloy foil members for each of the contacts on opposite sides of the groove, positioning them on the surface and subsequently etching with a silicon etch to provide the groove.

Referring to FIG. 2 together with FIG. 3 it is shown that by connecting together the first, second and third base contacts on each side of the groove and the first and second emitter contacts on each side of the groove there is provided the functional equivalent of two transistors having separate base and emitter electrodes but with a common collector as shown in FIG. 3. Of course, operation of the E contacts as emitters and C as collectors depends upon the application of proper biasing potentials. The interconnections may be formed by brazing gold plated silver bridges thereto at about 400° C. The resistance between the base contacts on opposite sides of the groove and between the emitter contacts on opposite sides of the groove is sufficiently great that it may be considered an open circuit. Therefore, while the substrate 10 provides the semiconductive material for the base regions for both of the transistors shown in the approximate equivalent circuit of FIG. 3, the groove 15 substantially prevents any electrical interaction between contacts on opposite sides of the groove.

Referring to FIG. 4 together with FIG. 5, there is shown another manner of interconnecting the contacts on the upper surface of the device. In this embodiment separate connections are made to the first base $B_1$ and to the second emitter $E_2$ with a common connection to the first emitter $E_1$ and the second and third bases $B_2$ and $B_3$ on each side of the groove. The resulting device performs as the approximate equivalent circuit of FIG. 5 wherein each side of the groove provides the equivalent of two transistors in cascade with a common collector. This embodiment is desirable in order to provide both a high power handling device and a high gain device. Here the two transistors on each side match in characteristics the transistors on the other sides. Other ways in which the contacts may be interconnected will suggest themselves to those skilled in the art to provide other multitransistor devices.

While the present invention has been shown and described in certain forms only, it will be obvious to those skilled in the art that it is not so limited but is susceptible of various changes and modifications without departing from the spirit and scope thereof.

What is claimed is:

1. A semiconductor power amplifier comprising: a substrate of semiconductive material of a first type of semiconductivity and having opposed major surfaces; at least two electrodes in rectifying contact with the first of said major surfaces; at least two electrodes in ohmic contact with said first major surface; at least one electrode in rectifying contact with the second of said major surfaces; said electrodes in rectifying contact with said first major surface being oppositely disposed from said at least one electrode in rectifying contact with said second major surface; said electrodes on said first major surface having an elongated configuration and disposed in a pattern comprising a first rectifying contact and a first ohmic contact in an electrically interacting relationship and a second rectifying contact and a second ohmic contact in an electrically interacting relationship; said first rectifying contact and said first ohmic contact being symmetrical with said second rectifying contact and said second ohmic contact about a line substantially through the center of said first major surface; said substrate having an isolating barrier extending along said line in said first major surface to provide a structure capable of operation as at least two matched transistor amplifiers having a common rectifying contact.

2. A semiconductor amplifier comprising: a substrate of semiconductive material of a first type of semiconductivity having opposed first and second major surfaces and having a plurality of fused electrodes on said opposed major surfaces to serve as base, emitter and collector electrodes; said electrodes comprising a plurality of elongated electrodes on said first major surface including at least a first and a second electrode disposed in electrically interacting relationship and a third and a fourth electrode disposed in electrically interacting relationship and a fifth electrode in contact with substantially all of said second major surface; said substrate having an isolating barrier therein substantially to isolate electrically said first and second electrodes from said third and fourth electrodes; said first and second electrodes in rectifying contact with a first of said major electrodes about said isolating barrier; and conductive interconnecting means to selectively interconnect electrodes on either side of said isolating barrier so as to provide at least two matched transistor amplifiers having a common region.

3. A semiconductor amplifier comprising: a substrate of semiconductive material of a first type of semiconductivity having opposed major surfaces; at least two electrodes in rectifying contact with a first of said major surfaces; at least two electrodes in ohmic contact with said first major surface; a continuous electrode in rectifying contact with substantially all of the second of said major surfaces; said continuous electrode to serve as the common collector of said device; said electrodes on said first major surface disposed in a pattern comprising a first emitter contact and a first base contact in electrically interacting relationship and a second emitter contact and a second base contact in electrically interacting relationship with a groove extending into said first major surface and substantially electrically isolating said first emitter and said first base contact from said second emitter and said second base contact; said electrodes on said first major surface being substantially arcuate and concentric and symmetrically disposed on opposite sides of said groove; interconnecting means conductively connected to selected electrodes on each side of said groove to provide the functional equivalent of a pair of matched transistor amplifiers having a common collector.

4. A semiconductor amplifier comprising: a substrate of semiconductive material of a first type of semiconductivity having opposed major surfaces; at least two electrodes in rectifying contact with a first of said major surfaces; at least two electrodes in ohmic contact with said first major surface; a continuous electrode in rectifying contact with substantially all of the second of said major surfaces; said continuous electrode to serve as the common collector of said device; said electrodes on said first major surface disposed in a pattern comprising an emitter contact and a base contact in electrically interacting relationship and a second emitter contact and a second base contact in electrically interacting relationship with a groove extending into said first major surface and substantially electrically isolating said first emitter and said first base contact from said second emitter and said second base contact; interconnecting means to conductively connect selected electrodes on each side of said groove to provide the functional equivalent of a pair of matched transistor amplifiers having a common collector; the electrodes on said first major surface comprising a center dot and four rings surrounding said dot and concentric therewith, each of said dot and rings being separated along the line defined by said groove.

5. A semiconductor device capable of providing multi-transistor functions and comprising: a first semiconductive region of a first type of semiconductivity serving as a common collector region; a second semiconductive region of a second type of semiconductivity in contact with said first region and forming a p–n junction therewith, said second region being effectively divided into two portions by an isolating barrier therein to serve as first and second base regions; a plurality of semiconductive regions of said first type of semiconductivity serving as emitter regions, equal numbers of which are in contact with each of said first and second base regions and form p-n junctions therewith, said emitter regions having an elongated configuration; means to make electrical contact to said collector region, said emitter regions and said base regions including at least one ohmic contact on each of said base regions having an elongated configuration and closely and uniformly spaced from said emitter regions; all of said regions and contacts being disposed to provide two symmetrical device portions on opposite sides of said isolating barrier, each capable of operating as one or more transistors with effective electrical isolation except in said collector region.

References Cited by the Examiner

UNITED STATES PATENTS

| | | | |
|---|---|---|---|
| 3,029,366 | 4/1962 | Lehovec. | |
| 3,046,405 | 7/1962 | Emeis. | |
| 3,063,129 | 11/1962 | Thomas | 29—25.3 |
| 3,089,219 | 5/1963 | Williams | 29—25.3 |
| 3,090,873 | 5/1963 | Mackintosh | 307—88.5 |
| 3,103,599 | 9/1963 | Henkels | 307—88.5 |

OTHER REFERENCES

Pages 99–104, November 1960, Function-Oriented Approaches, Electronics.

Pages 26–27, May 1961, Schwartz, Integrated Circuit Package, IBM Tech. Discl. Bull., vol. 3, No. 12.

Page 2, August 1961, Fairchild Semiconductor, Special Products, (100 transistor/diode multiples).

ROY LAKE, *Primary Examiner.*

NATHAN KAUFMAN, *Examiner.*

F. D. PARIS, *Assistant Examiner.*